United States Patent
Atsumi et al.

(10) Patent No.: US 10,698,144 B2
(45) Date of Patent: Jun. 30, 2020

(54) PHASE DIFFERENCE FILM, OPTICAL FILM, AND DISPLAY DEVICE

(71) Applicant: FUJIFILM Corporation, Tokyo (JP)

(72) Inventors: Kunihiro Atsumi, Kanagawa (JP); Yukito Saitoh, Kanagawa (JP); Shinichi Morishima, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/445,819

(22) Filed: Jun. 19, 2019

(65) Prior Publication Data

US 2019/0302334 A1 Oct. 3, 2019

Related U.S. Application Data

(63) Continuation of application No. PCT/JP2017/046461, filed on Dec. 25, 2017.

(30) Foreign Application Priority Data

Dec. 26, 2016 (JP) .................. 2016-251636

(51) Int. Cl.
*B32B 7/02* (2019.01)
*G02B 5/30* (2006.01)
(Continued)

(52) U.S. Cl.
CPC ............ *G02B 5/3016* (2013.01); *B29C 33/40* (2013.01); *B29C 41/003* (2013.01); *B29C 41/02* (2013.01);
(Continued)

(58) Field of Classification Search
CPC ....... B29C 33/40; B29C 41/003; B29C 41/02; B29L 2011/00; C09K 19/3486;
(Continued)

(56) References Cited

U.S. PATENT DOCUMENTS

2008/0211996 A1 9/2008 Saitoh et al.
2008/0239491 A1 10/2008 Zheng et al.
(Continued)

FOREIGN PATENT DOCUMENTS

JP 5-157911 A 6/1993
JP 2006-078539 3/2006
(Continued)

OTHER PUBLICATIONS

International Search Report Issued in PCT/JP2017/046461 dated Mar. 6, 2018.
(Continued)

*Primary Examiner* — Lawrence D Ferguson
(74) *Attorney, Agent, or Firm* — Edwards Neils LLC; Jean C. Edwards, Esq.

(57) ABSTRACT

A phase difference film is formed by using a liquid crystal compound and that indicates an Nz factor of more than 0 and less than 1, an optical film with same, and a display device. The phase difference film is formed by using a composition including a polymerizable liquid crystal compound having a mesogen group, where an order parameter of the mesogen group in an in-plane slow axis direction of the phase difference film is set as Sx, an order parameter of the mesogen group in a direction orthogonal to the in-plane slow axis direction in a plane is set as Sy, and an order parameter of the mesogen group in a thickness direction of the phase difference film is set as Sz, in a case where the mesogen group has a rod or a disc shape, differing Expressions are satisfied.

20 Claims, 1 Drawing Sheet

(51) Int. Cl.
*B29C 33/40* (2006.01)
*B29C 41/00* (2006.01)
*B29C 41/02* (2006.01)
*C09K 19/38* (2006.01)
*G02F 1/13363* (2006.01)
*G02F 1/13* (2006.01)
*B29L 11/00* (2006.01)
*H01L 27/32* (2006.01)
*H05B 33/02* (2006.01)
*G09F 9/30* (2006.01)
*H01L 51/50* (2006.01)

(52) U.S. Cl.
CPC ...... *C09K 19/3861* (2013.01); *C09K 19/3895* (2013.01); *G02B 5/30* (2013.01); *G02F 1/13* (2013.01); *G02F 1/13363* (2013.01); *B29L 2011/00* (2013.01); *G09F 9/30* (2013.01); *H01L 27/32* (2013.01); *H01L 51/50* (2013.01); *H05B 33/02* (2013.01)

(58) Field of Classification Search
CPC ............ C09K 19/3491; C09K 19/3852; C09K 19/3861; C09K 19/3895; C09K 2019/0448; G02B 5/30; G02B 5/3016; G02F 1/13; G02F 1/13363; G09F 9/30; H01L 27/32; H01L 51/50; H05B 33/02
See application file for complete search history.

(56) References Cited

U.S. PATENT DOCUMENTS

| | | |
|---|---|---|
| 2008/0241565 A1 | 10/2008 | Germroth et al. |
| 2015/0029445 A1 | 1/2015 | Takeda et al. |
| 2016/0131809 A1 | 5/2016 | Takeda et al. |

FOREIGN PATENT DOCUMENTS

| | | |
|---|---|---|
| JP | 2010-522900 A | 7/2010 |
| JP | 2010-522902 A | 7/2010 |
| JP | 2015-043073 | 3/2015 |
| WO | 2015/008773 A1 | 1/2015 |

OTHER PUBLICATIONS

Written Opinion Issued in PCT/JP2017/046461 dated Mar. 6, 2018.
International Preliminary Report on Patentability Issued in PCT/JP2017/046461 dated Apr. 5, 2019.

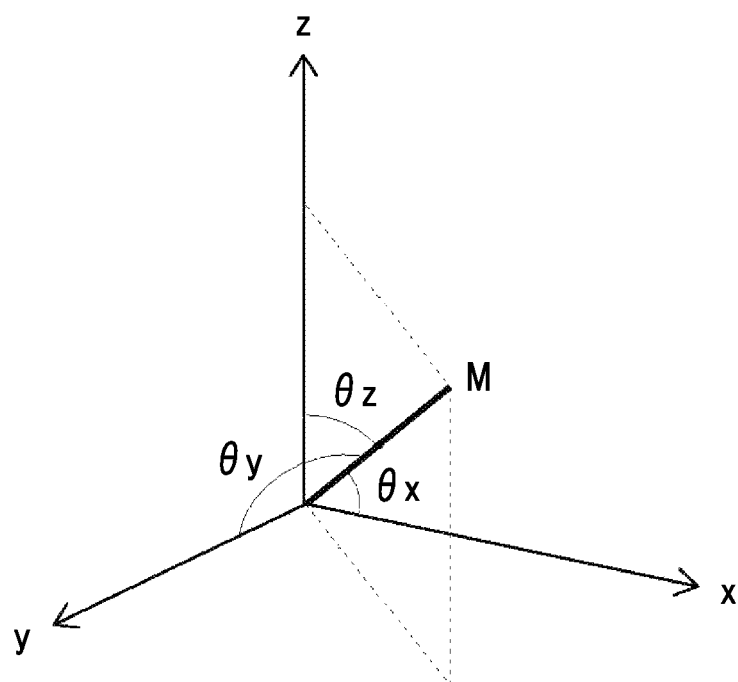

PHASE DIFFERENCE FILM, OPTICAL FILM, AND DISPLAY DEVICE

CROSS-REFERENCE TO RELATED APPLICATIONS

This application is a Continuation of PCT International Application No. PCT/JP2017/046461 filed on Dec. 25, 2017, which was published under Article 21(2) in Japanese, and which claims priority under 35 U.S.C. § 119(a) to Japanese Patent Application No. 2016-251636 filed on Dec. 26, 2016. The above applications are hereby expressly incorporated by reference, in their entirety, into the present application.

BACKGROUND OF THE INVENTION

1. Field of the Invention

The present invention relates to a phase difference film, an optical film, and a display device.

2. Description of the Related Art

A phase difference film having refractive index anisotropy is applied to various applications such as an antireflection film of a display device and an optical compensation film of a liquid crystal display device.

Recently, further improvement of characteristics required in the phase difference film has been required, and control of three-dimensional refractive index distribution defined by an Nz factor has become very important. Among these, the phase difference film satisfying 0<Nz<1 can be appropriately applied in various applications. For example, the phase difference film satisfying Nz=0.5 has a substantially constant phase difference value regardless of an angle of view, and in a case where the phase difference film is used, the characteristics of the angle of view of the liquid crystal display device are significantly improved.

For example, as a phase difference film satisfying 0<Nz<1, JP1995-157911A (JP-H05-157911A) suggests a film (phase difference film) obtained by bonding a heat shrinkable film to a resin film such as polycarbonate to form a laminate, stretching the laminate, and then peeling off the heat shrinkable film (JP1995-157911A (JP-H05-157911A)).

SUMMARY OF THE INVENTION

Meanwhile, since the phase difference film disclosed in JP1995-157911A (JP-H05-157911A) is formed by using a polymer, there is a problem in that the thickness of the obtained phase difference film is thick.

Meanwhile, though the thickness of the phase difference film obtained by using a liquid crystal compound can be caused to be thin, a phase difference film that indicates an Nz factor in a predetermined range which is formed by using a liquid crystal compound has not been developed in the related art.

In view of the above circumstances, an object of the present invention is to provide a phase difference film that is formed by using a liquid crystal compound and that indicates an Nz factor of more than 0 and less than 1.

Another object of the present invention is to provide an optical film including the phase difference film and a display device.

The present inventors have diligently conducted research on the problems in the related art and as a result, have found that the above objects can be achieved by adjusting an order parameter of a mesogen group included in the liquid crystal compound to a predetermined amount.

That is, the present inventors have found that the above objects can be achieved by the following configurations.

(1) A phase difference film formed by using a composition including a polymerizable liquid crystal compound having a mesogen group, in which, in the phase difference film, in a case where an order parameter of the mesogen group in an in-plane slow axis direction of the phase difference film is set as Sx, an order parameter of the mesogen group in a direction orthogonal to the in-plane slow axis direction in a plane is set as Sy, and an order parameter of the mesogen group in a thickness direction of the phase difference film is set as Sz, in a case where the mesogen group has a rod shape, requirements of Expressions (1) to (3) are satisfied, and in a case where the mesogen group has a disc shape, requirements of Expressions (4) to (6) are satisfied.

(2) The phase difference film according to (1), in which, in a case where the mesogen group has a rod shape, requirements of Expressions (1), (3), and (7) are satisfied, and in a case where the mesogen group has a disc shape, requirements of Expressions (4), (6), and (8) are satisfied.

(3) The phase difference film according to (1) or (2), in which a film thickness is 20.0 μm or less.

(4) The phase difference film according to any one of (1) to (3), which has a single layer structure.

(5) An optical film comprising: the phase difference film according to any one of (1) to (4).

(6) The optical film according to (5), further comprising: a polarizer.

(7) A display device comprising: the phase difference film according to any one of (1) to (4), or the optical film according to (5) or (6).

According to the present invention, it is possible to provide a phase difference film indicating an Nz factor of more than 0 and less than 1 which is formed by using a liquid crystal compound.

According to the present invention, an optical film including the phase difference film and a display device can be provided.

BRIEF DESCRIPTION OF THE DRAWINGS

FIG. 1 is a diagram illustrating an order parameter in each axis direction.

DESCRIPTION OF THE PREFERRED EMBODIMENTS

Hereinafter, the present invention is specifically described. In the present specification, a numerical range represented using "to" means a range including numerical values described before and after "to" as the lower limit and the upper limit. First, terms used in the present specification are described.

In the present invention, Re ($\lambda$) and Rth ($\lambda$) respectively represent the in-plane retardation and the retardation in the thickness direction at the wavelength $\lambda$. Unless described otherwise, the wavelength k is 550 nm.

According to the present invention, Re ($\lambda$) and Rth ($\lambda$) are values measured at wavelength $\lambda$ in AxoScan OPMF-1

(manufactured by Opto Science Inc.). By inputting an average refractive index ((Nx+Ny+Nz)/3) and a film thickness (d (μm)) in AxoScan, slow axis direction (°), $Re(\lambda) = R0(\lambda)$, and $Rth(\lambda) = ((nx+ny)/2 - nz) \times d$ are calculated.

R0 (λ) is indicated by a numerical value calculated by AxoScan OPMF-1, but means Re (λ).

In the present specification, the refractive indexes nx, ny, and nz are measured using an Abbe refractive index (NAR-4T, manufactured by Atago Co., Ltd.) and a sodium lamp (λ=589 nm) as a light source. In a case where the wavelength dependency is measured, the wavelength dependency can be measured by a multi-wavelength Abbe refractometer DR-M2 (manufactured by Atago Co., Ltd.) in combination with an interference filter.

Values of Polymer Handbook (JOHN WILEY & SONS, INC.) and catalog of various optical films can be used. The values of the average refractive indexes of the main optical films are exemplified below: cellulose acylate (1.48), a cycloolefin polymer (1.52), polycarbonate (1.59), polymethyl methacrylate (1.49), and polystyrene (1.59).

In the present specification, an Nz factor is a value given by Nz=(nx−nz)/(nx−ny).

In the present specification, "visible light" indicates light at a wavelength of 380 to 780 nm.

In the present specification, an angle (for example, an angle of "90°" or the like), and a relationship thereof (for example "orthogonal", "parallel", "to cross at 450", and the like) include an error range which is allowable in the technical field belonging to the present invention. For example, the angle means an angle in a range of less than ±10° of an exact angle, and an error with respect to the exact angle is preferably 50 or less, and is more preferably 3° or less.

In the present specification, an "absorption axis" of a polarizer means a direction with the highest absorbance. A "transmission axis" means a direction which forms an angle of 90° to the "absorption axis".

In the present specification, an "in-plane slow axis" of a phase difference film or the like means a direction in which a refractive index in a plane is maximized.

One of the feature points of the phase difference film according to the embodiment of the present invention is that the order parameter of the mesogen group in the phase difference film in each direction is adjusted to a predetermined range. As described below in detail, the predetermined order parameters defined in the present invention are parameters representing the degree of the mesogen groups in each direction of the alignment, and the present inventors have found that it is possible to obtain a phase difference film indicating a desired Nz factor by setting these in predetermined ranges.

The phase difference film according to the embodiment of the present invention is a phase difference film that is formed by using a composition including a polymerizable liquid crystal compound having a mesogen group, in which, in a case where, in the phase difference film, an order parameter of the mesogen group in an in-plane slow axis direction of the phase difference film is set as Sx, an order parameter of the mesogen group in a direction orthogonal to the in-plane slow axis direction in the plane is set as Sy, and an order parameter of the mesogen group in a thickness direction of the phase difference film is set as Sz, in a case where the mesogen group has a rod shape, the requirements of Expressions (1) to (3) are satisfied, and in a case where the mesogen group has a disc shape, the requirements of Expressions (4) to (6) are satisfied.

Hereinafter, the point of the order parameter that is a feature point of a phase difference film is described, a material that constitutes the phase difference film, and a manufacturing method thereof are described.

<Order Parameter>

Generally, an order parameter has been known as a parameter that represents the degree of alignment of a liquid crystal compound. The order parameter in a case of having no distribution like a crystal is 1, and the order parameter in a case of being completely random like a liquid state is 0. For example, in the nematic liquid crystals, the value is generally about 0.6. The order parameter is specifically described, for example, in DE JEU, W. H. (Author) "Physical Properties of Liquid Crystal" (Kyoritsu Shuppan Co., Ltd., 1991, page 11) and is expressed by the following expression.

$$S = \frac{3\langle\cos^2\theta\rangle - 1}{2}$$

Here, θ is an angle formed by the average alignment axis direction of alignment elements (for example, liquid crystal compound) and the axis of each alignment element.

In the present specification, as illustrated in FIG. 1, in a case where the in-plane slow axis direction of the phase difference film is set as the x axis, the direction orthogonal to the in-plane slow axis direction is set as the y axis, and the thickness direction of the phase difference film is set as the z axis, and angles between the average alignment direction M of the mesogen groups obtained by alignment analysis, and the x axis, the y axis, and the z axis are $\theta_X$, $\theta_Y$, and $\theta_Z$, the order parameter Sx of the mesogen group in the x direction, the order parameter Sy in the y direction, and the order parameter Sz in the z direction are respectively represented by the following expressions.

$$Sx = \frac{3\langle\cos^2\theta x\rangle - 1}{2}$$

$$Sy = \frac{3\langle\cos^2\theta y\rangle - 1}{2}$$

$$Sz = \frac{3\langle\cos^2\theta z\rangle - 1}{2}$$

Examples of the method of measuring the order parameter of the mesogen group in the phase difference film in the respective directions include the polarization Raman spectrum measurement.

Specifically, nanofider (manufactured by Tokyo Instruments Inc.) is used as a determination device for the polarization Raman spectrum measurement. First, the in-plane slow axis (x-axis) direction of the phase difference film is specified by using AxoScan OPMF-1 (manufactured by Opto Science Inc.). Subsequently, the polarization Raman spectrum measurement is performed with the main surface (xy plane) of the phase difference film, the first cross section (xz plane) of the phase difference film, and the second cross section (yz plane) of the phase difference film as measurement surfaces. The first and second cross sections are cross sections exposed by cutting the phase difference film in a predetermined direction. The first cross section is a cross section formed by cutting the phase difference film in a direction parallel to the x axis and vertical to the main surface. The second cross section is a cross section formed by cutting the phase difference film in a direction parallel to the y axis and vertical to the main surface.

As a specific method of the polarization Raman spectrum measurement, polarization is rotated at several angles at a predetermined excitation wavelength (for example, 785 nm), and the polarization Raman spectra in directions parallel thereto and vertical thereto are measured. Subsequently, according to the method disclosed in Naoki Hayashi, Tatsuhisa Kato, Phys. Rev. E, 63, 021706 (2001), fitting analysis based on the least square method is performed by the theoretically lead expression with respect to a band having a peak derived from the skeleton of a mesogen group included in the layer and the second order parameters Sxy, Syx, Syz, Szy, Sxz, and Szx in the measurement plane are calculated. Order parameters Sx, Sy, and Sz in each axis direction are calculated based on the following expression.

$$Sx=(Sxy+Sxz)/2$$

$$Sy=(Syx+Syz)/2$$

$$Sz=(Szx+Szy)/2$$

The structure of the mesogen group in the phase difference film can be determined by thermal decomposition gas chromatography-mass spectrometry (GC-MS), infrared (IR) spectrum measurement, and nuclear magnetic resonance (NMR) measurement. In a case where the structure of the polymerizable liquid crystal compound to be used is known in advance, the structure of the mesogen group in the phase difference film can be determined from the structure.

In a case where the structural regions used for alignment analysis of the mesogen group are parallel to the reference axis of the mesogen group, an analysis result can be used without change. In a case where the structural regions used for the alignment analysis of the mesogen group is orthogonal to the reference axis of the mesogen group, the analysis result was converted according to the direction to the reference axis of the mesogen group. For example, in the case where a liquid crystal compound in which structural regions used for alignment analysis of the mesogen group are orthogonal to the reference axis of the mesogen group exhibits nematic liquid crystallinity, the liquid crystal compound is uniaxially aligned, and thus the order parameter of the mesogen group along each axis can be calculated by converting measured values ($S_{X\perp}$, $S_{Y\perp}$, and $S_{Z\perp}$) obtained by the above measurement, by using Expressions (λ) to (Z).

The reference axis is an axis for calculating the order parameter and varies depending on the type of mesogen group. Details are described below.

$$S_X=-2S_{X\perp} \quad \text{Expression (X)}$$

$$S_Y=-2S_{Y\perp} \quad \text{Expression (Y)}$$

$$S_Z=-2S_{Z\perp} \quad \text{Expression (Z)}$$

In a case where the order parameter is calculated, the reference axis changes depending on the type of mesogen group. Specifically, in a case where the mesogen group has a rod shape, the order parameter is calculated based on the long axis of the mesogen group. That is, the long axis of the mesogen group is the reference axis, and the angles formed by the average alignment direction of the long axis of the mesogen group and the x axis, the y axis, and the z axis are respectively set as $\theta_X$, $\theta_Y$, and $\theta_Z$, so as to calculate order parameters.

In a case where the mesogen group has a disc shape, the order parameter is calculated based on the axis orthogonal to the disc plane of the mesogen group. That is, the axis orthogonal to the disc plane of the mesogen group is the reference axis, and the angles formed by the average alignment direction of the axis orthogonal to the disc shape of the mesogen group and the x axis, the y axis, and the z axis are respectively set as $\theta_X$, $\theta_Y$, and $\theta_Z$, so as to calculate order parameters.

In a case where the mesogen group is a rod shape, the requirements of Expressions (1) to (3) are satisfied.

$$Sx>Sz>Sy \quad \text{Expression (1)}$$

$$-0.300<Sz<0.200 \text{ (preferably } -0.100<Sz<0.100\text{)} \quad \text{Expression (2)}$$

$$Sx>0.050 \quad \text{Expression (3)}$$

Among these, it is preferable to satisfy the requirements of Expressions (1), (3), and (7) in that the Nz factor of the phase difference film is closer to 0.50.

$$Sx>Sz>Sy \quad \text{Expression (1)}$$

$$-0.040<Sz<0.040 \quad \text{Expression (7)}$$

$$Sx>0.050 \quad \text{Expression (3)}$$

Sx is preferably 0.100 or more and more preferably 0.200 or more. The upper limit is not particularly limited, but is 0.400 or less in many cases.

Sy is preferably −0.100 or less and more preferably −0.200 or less. The lower limit is not particularly limited, but is −0.400 or more in many cases.

The difference between the absolute value of Sx and the absolute value of Sy is preferably 0.100 or less and more preferably 0.040 or less. The lower limit is not particularly limited but is preferably 0.

In a case where the mesogen group has a disc shape, the requirements of Expressions (4) to (6) are satisfied.

$$Sy>Sz>Sx \quad \text{Expression (4)}$$

$$-0.200<Sz<0.300 \text{ (preferably } -0.100<Sz<0.100\text{)} \quad \text{Expression (5)}$$

$$Sy>0.050 \quad \text{Expression (6)}$$

Among these, it is preferable to satisfy the requirements of Expressions (4), (6), and (8) in that the Nz factor of the phase difference film is closer to 0.50.

$$Sy>Sz>Sx \quad \text{Expression (4)}$$

$$-0.040<Sz<0.040 \quad \text{Expression (8)}$$

$$Sy>0.050 \quad \text{Expression (6)}$$

Sx is preferably −0.100 or less and more preferably −0.200 or less. The lower limit is not particularly limited, but is −0.400 or more in many cases.

Sy is preferably 0.100 or more and more preferably 0.200 or more. The upper limit is not particularly limited but is often 0.400 or less.

The difference between the absolute value of Sx and the absolute value of Sy is preferably 0.100 or less and more preferably 0.040 or less. The lower limit is not particularly limited but is preferably 0.

<Material of Phase Difference Film>

The phase difference film is formed by using a composition including a polymerizable liquid crystal compound having a mesogen group.

The type of the polymerizable liquid crystal compound having a mesogen group is not particularly limited, and examples thereof include the well-known polymerizable liquid crystal compounds. The mesogen group is a functional group which is rigid and has alignment properties. Examples of the structure of the mesogen group include a structure in which a plurality of groups selected from the group consisting of an aromatic ring group and an alicyclic group are linked directly or via a linking group (for example, —CO—, —O—, —NR— (R represents a hydrogen atom or an alkyl group), or a group obtained by combining these).

The polymerizable liquid crystal compound is a liquid crystal compound having a polymerizable group.

The type of the polymerizable group is not particularly limited, but a polymerizable group capable of radical polymerization or cationic polymerization is preferable.

A well-known radically polymerizable group can be used as a radically polymerizable group, and an acryloyl group or a methacryloyl group is preferable.

As a cationically polymerizable group, a well-known cationically polymerizable group can be used, and specific examples thereof include an alicyclic ether group, a cyclic acetal group, a cyclic lactone group, a cyclic thioether group, a spiroorthoester group, and a vinyloxy group. Among them, an alicyclic ether group or a vinyloxy group is preferable, and an epoxy group, an oxetanyl group, or a vinyloxy group is more preferable.

Particularly, examples of the preferable polymerizable groups include the following.

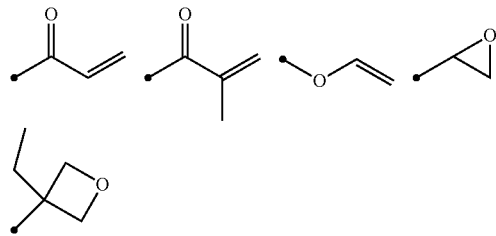

The number of polymerizable groups in the polymerizable liquid crystal compound is not particularly limited, but is preferably 3 or less.

It is also preferable that the polymerizable liquid crystal compound has both a radically polymerizable group and a cationically polymerizable group.

The type of the polymerizable liquid crystal compound is not particularly limited, and examples thereof include a rod-like liquid crystal compound in which the shape of the mesogen group is a rod shape and a disc-like liquid crystal compound in which the shape of the mesogen group is a disc shape.

The rod-like mesogen group means a mesogen group having a structure in which the main skeleton is linear, and the disc-like mesogen group means a mesogen group having a structure in which the main skeleton radially extends.

The polymerizable liquid crystal compounds further include a low molecular type compound and a high molecular type compound, respectively. The polymer type compound generally refers to a polymer having a degree of polymerization of 100 or more (Polymer Physics•Phase Transition Dynamics, written by Masao Doi, page 2, Iwanami Shoten, Publishers, 1992). Any polymerizable liquid crystal compound can also be used in the present invention.

Among these, preferable examples thereof include a compound represented by Formula (I) in that the control of order parameters is more easily performed by a stretching treatment and/or a shrinkage treatment described below.

$$L_1\text{-}G_1\text{-}D_1\text{-}Ar\text{-}D_2\text{-}G_2\text{-}L_2 \qquad \text{Formula (I)}$$

$D_1$ and $D_2$ each independently represent —CO—O—, —O—CO—, —C(=S)O—, —O—C(=S)—, —$CR^1R^2$—, —$CR^1R^2$—$CR^3R^4$—, —O—$CR^1R^2$—, —$CR^1R^2$—O—, —$CR^1R^2$—O—$CR^3R^4$—, —$CR^1R^2$—O—CO—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, —$CR^1R^2$—$NR^3$—, —CO—$NR^1$—, or —$NR^1$—CO—, $R^1$, $R^2$, $R^3$, and $R^4$ each independently represent a hydrogen atom, a halogen atom, or an alkyl group having 1 to 4 carbon atoms.

$G_1$ and $G_2$ each independently represent a divalent alicyclic hydrocarbon group having 5 to 8 carbon atoms, and the methylene group included in the alicyclic hydrocarbon group may be substituted by —O—, —S—, or —$NR^6$—, and $R^6$ represents a hydrogen atom or an alkyl group having 1 to 6 carbon atoms.

$L_1$ and $L_2$ each independently represent a monovalent organic group, and at least one selected from the group consisting of $L_1$ and $L_2$ represents a monovalent group having a polymerizable group. Among these, it is preferable that one of $L_1$ and $L_2$ represents a monovalent group having a polymerizable group, and the other represents a monovalent organic group not including a polymerizable group, or one of $L_1$ and $L_2$ represents a radically polymerizable group, and the other represents a cationically polymerizable group.

Ar represents a divalent aromatic ring group represented by Formula (II-1), (II-2), (II-3), or (II-4).

Formula

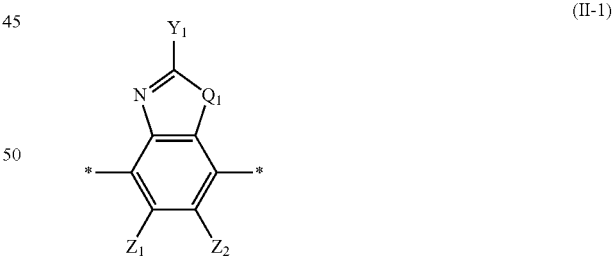

(II-1)

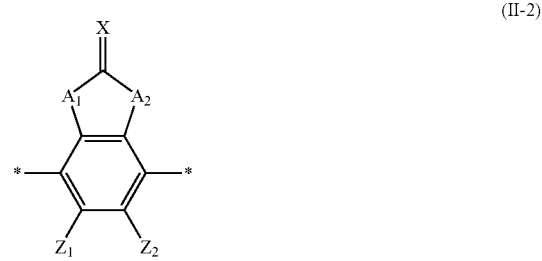

(II-2)

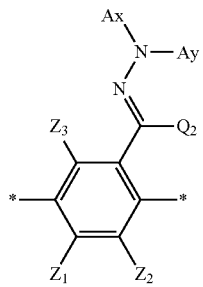

(II-3)

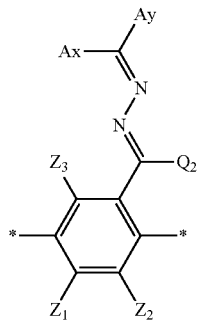

(II-4)

$Q_1$ represents —S—, —O—, or —NR$^{11}$—, and R$^{11}$ represents a hydrogen atom or an alkyl group having 1 to 6 carbon atoms. $Y_1$ represents an aromatic hydrocarbon group having 6 to 12 carbon atoms or an aromatic heterocyclic group having 3 to 12 carbon atoms. $Z_1$, $Z_2$, and $Z_3$ each independently represent a hydrogen atom, an aliphatic hydrocarbon group having 1 to 20 carbon atoms, an alicyclic hydrocarbon group having 3 to 20 carbon atoms, a monovalent aromatic hydrocarbon group having 6 to 20 carbon atoms, a halogen atom, a cyano group, a nitro group, —NR$^{12}$R$^{13}$, or —SR$^{12}$. $Z_1$ and $Z_2$ are bonded to each other to form an aromatic hydrocarbon ring or an aromatic heterocyclic ring, and R$^{12}$ and R$^{13}$ each independently represent a hydrogen atom or an alkyl group having 1 to 6 carbon atoms. $A_1$ and $A_2$ each independently represent a group selected from the group consisting of —O—, —NR$^{21}$—(R$^{21}$ represents a hydrogen atom or a substituent.), —S—, and —CO—. X represents a hydrogen atom or a nonmetallic atom of Groups 14 to 16 to which a substituent may be bonded. Ax represents an organic group having 2 to 30 carbon atoms which has at least one aromatic ring selected from the group consisting of an aromatic hydrocarbon ring and an aromatic heterocyclic ring. Ay represents a hydrogen atom, an alkyl group having 1 to 6 carbon atoms which may have a substituent, or an organic group having 2 to 30 carbon atoms which has at least one aromatic ring selected from the group consisting of an aromatic hydrocarbon ring and an aromatic heterocyclic ring. The aromatic ring included in Ax and Ay may have a substituent, and Ax and Ay may be bonded to each other to form a ring. $Q_2$ represents a hydrogen atom or an alkyl group having 1 to 6 carbon atoms which may have a substituent.

With respect to the definition and the preferable range of each substituent of a compound represented by Formula (I), the disclosure relating to D$^1$, D$^2$, G$^1$, G$^2$, L$^1$, L$^2$, R$^4$, R$^5$, R$^6$, R$^7$, X$^1$, Y$^1$, Q$^1$, and Q$^2$ of the compound (λ) disclosed in JP2012-021068A can be referred to, respectively for $D_1$, $D_2$, $G_1$, $G_2$, $L_1$, $L_2$, R$^1$, R$^2$, R$^3$, R$^4$, $Q_1$, $Y_1$, $Z_1$, and $Z_2$ of Formula (I), the disclosure relating to $A_1$, $A_2$, and X of the compound represented by Formula (I) of JP2008-107767A can be referred to, respectively for $A_1$, $A_2$, and X of Formula (I), and the disclosure relating to Ax, Ay, and Q$^1$ of the compound represented by Formula (I) disclosed in WO2013/018526A can be referred to, respectively for Ax, Ay, and $Q_2$ of Formula (I). With respect to $Z_3$, the disclosure relating to Q$^1$ of the compound (A) disclosed in JP2012-021068A can be referred to.

One of $L_1$ and $L_2$ is preferably a group represented by -D$_3$-G$_3$-Sp-P$_3$.

$D_3$ has the same meaning as $D_1$.

$G_3$ represents a single bond, a divalent aromatic ring group or heterocyclic group having 6 to 12 carbon atoms, or a divalent alicyclic hydrocarbon group having 5 to 8 carbon atoms, and the methylene group included in the alicyclic hydrocarbon group may be substituted by —O—, —S—, or NR$^7$—, here, R$^7$ represents a hydrogen atom or an alkyl group having 1 to 6 carbon atoms.

Sp represents a single bond, an alkylene group, —O—, —C(=O)—, —NR$^8$—, or a group obtained by combining these. Examples of the combined group include —(CH$_2$)$_n$—, —(CH$_2$)$_n$—O—, —(CH$_2$—O—)$_n$—, —(CH$_2$CH$_2$—O—)$_m$, —O—(CH$_2$)$_n$—, —O—(CH$_2$)$_n$—O—, —O—(CH$_2$—O—)$_n$—, —O—(CH$_2$CH$_2$—O—)$_m$, —C(=O)—O—(CH$_2$)$_n$—, —C(=O)—O—(CH$_2$)$_n$—O—, —C(=O)—O—(CH$_2$CH$_2$—O—)$_m$, —(CH$_2$—O—)$_n$—, —C(=O)—O—(CH$_2$CH$_2$—O—)$_m$, —C(=O)—NR$^1$—(CH$_2$)$_n$—, —C(=O)—NR$^8$—(CH$_2$)$_n$—O—, —C(=O)—NR$^8$—(CH$_2$—O—)$_n$—, —C(=O)—NR$^8$—(CH$_2$CH$_2$—O—)$_m$, and —(CH$_2$)$_n$—O—C(=O)—(CH$_2$)$_n$—C(=O)—O—(CH$_2$)$_n$—. Here, n represents an integer of 2 to 12, m represents an integer of 2 to 6, and R$^8$ represents a hydrogen atom or an alkyl group having 1 to 6 carbon atoms.

$P_3$ represents a polymerizable group. The definition of the polymerizable group is as described above.

The other of $L_1$ and $L_2$ is preferably a monovalent organic group not including a polymerizable group or a polymerizable group different from $P_3$, and examples thereof include an aliphatic hydrocarbon group having 1 to 20 carbon atoms, an alicyclic hydrocarbon group having 3 to 20 carbon atoms, and a monovalent aromatic hydrocarbon group having 6 to 20 carbon atoms. In addition, the aliphatic hydrocarbon group, the alicyclic hydrocarbon group, and the aromatic hydrocarbon group, may be substituted to a substituent, and examples of the substituent include an alkyl group.

As the disc-like liquid crystal compound, for example, compounds disclosed in JP2007-108732A or JP2010-244038A are preferable.

The content of the polymerizable liquid crystal compound having a mesogen group in the composition is not particularly limited, but is preferably 50 mass % or more, more preferably 70 mass % or more, and even more preferably 90 mass % or more with respect to the total solid content in the composition, in view of easier adjustment of order parameters. The upper limit is not particularly limited, but is 99 mass % or less in many cases.

The solvent is not contained in the total solid content in the composition.

The composition may contain components in addition to the polymerizable liquid crystal compound having a mesogen group.

For example, the composition may include a polymerization initiator. The polymerization initiator to be used is selected according to the type of polymerization reaction, and examples thereof include a thermal polymerization initiator and a photopolymerization initiator. For example, examples of the photopolymerization initiator include an α-carbonyl compound, acyloin ether, an α-hydrocarbon substituted aromatic acyloin compound, a polynuclear quinone compound, and a combination of a triarylimidazole dimer and p-aminophenyl ketone.

The content of the polymerization initiator is preferably 0.01 to 20 mass % and more preferably 0.5 to 5 mass % with respect to the total solid content of the composition.

The composition may further include a polymerizable compound (polymerizable monomer) in addition to the polymerizable liquid crystal compound in view of the uniformity of the coating film and the strength of the film.

Examples of the polymerizable compound include radically polymerizable or cationically polymerizable compounds. Among these, those copolymerizable with the polymerizable liquid crystal compound are preferable, and polyfunctional radically polymerizable monomers are more preferable. Examples thereof include those described in paragraphs [0018] to [0020] in JP2002-296423A.

The content of the polymerizable compound is preferably 1 to 50 mass % and more preferably 2 to 30 mass % with respect to the total mass of the polymerizable liquid crystal compound.

The composition may further include a surfactant in view of the uniformity of the coating film and the strength of the film.

Examples of the surfactant include compounds well-known in the related art, but a fluorine-based compound is preferable. Specific examples thereof include compounds disclosed in paragraphs [0028] to [0056] of JP2001-330725A.

The composition may include a solvent, and the solvent is preferably an organic solvent. Examples of the organic solvent include amide (for example, N,N-dimethyl formamide), sulfoxide (for example, dimethyl sulfoxide), a heterocyclic compound (for example, pyridine), hydrocarbon (for example, benzene and hexane), alkyl halide (for example, chloroform and dichloromethane), ester (for example, methyl acetate, ethyl acetate and butyl acetate), ketone (for example, acetone and methyl ethyl ketone), and ether (for example, tetrahydrofuran and 1,2-dimethoxyethane). Among these, the alkyl halide or the ketone is preferable. Two or more types of organic solvents may be used in combination.

The composition may also include various alignment control agents such as a vertical alignment agent and a horizontal alignment agent. These alignment control agents are compounds capable of horizontally or vertically controlling the alignment of the liquid crystal compound on the interface side.

In addition to the above components, the composition may further include an adhesion improver, a plasticizer, and a polymer.

<Method of Manufacturing Phase Difference Film>

The method of manufacturing the phase difference film is not particularly limited as long as the phase difference film indicating the above features can be obtained. The method of manufacturing the phase difference film preferably has steps 1 to 3 described below.

Hereinafter, the procedures of the steps 1 to 3 are specifically described.

(Step 1)

The step 1 is a step of coating a support with a composition including a polymerizable liquid crystal compound having a mesogen group to form a coating film, and performing an alignment treatment on the coating film so as to align the polymerizable liquid crystal compound.

The support used in the step 1 is a member having a function as a base material for applying the composition. The support may be a temporary support that is peeled off after applying and curing the composition or a temporary support that is peeled off after being stretched.

The optical film described below does not need to contain a support.

As a support (temporary support), a glass substrate may be used in addition to a plastic film. Examples of the material constituting the plastic film include polyester such as polyethylene terephthalate (PET), polycarbonate, an acrylic resin, an epoxy resin, polyurethane, polyamide, polyolefin, a cellulose derivative, silicone, and polyvinyl alcohol (PVA).

The thickness of the support may be about 5 to 1,000 μm, is preferably 10 to 250 μm, and more preferably 15 to 90 μm.

If necessary, an alignment layer may be disposed on the support.

The alignment layer generally includes a polymer as a main component. A polymer for the alignment layer is described in many documents and many commercially available products can be obtained. The polymer to be used is preferably polyvinyl alcohol, polyimide, or a derivative thereof.

A well-known rubbing treatment is preferably performed on the alignment layer.

The thickness of the alignment layer is preferably 0.01 to 10 μm, and more preferably 0.01 to 1 μm.

The method of applying the composition includes well-known methods such as a curtain coating method, a dip coating method, a spin coating method, a printing coating method, a spray coating method, a slot coating method, a roll coating method, a slide coating method, a blade coating method, a gravure coating method, and a wire bar method. In any of the coating methods, single-layer coating is preferable.

An alignment treatment is performed on the coating film formed on the support so as to align the polymerizable liquid crystal compound in the coating film.

The alignment treatment can be performed by drying the coating film in room temperature or heating the coating film. In the case of a thermotropic liquid crystal compound, the liquid crystal phase formed in the alignment treatment can generally be transferred by a change in temperature or pressure. In the case of a liquid crystal compound having lyotropic properties, transfer can also be performed by a compositional ratio such as the amount of the solvent.

The conditions in a case of heating the coating film are not particularly limited, but the heating temperature is preferably 50° C. to 150° C., and the heating time is preferably 10 seconds to 5 minutes.

(Step 2)

The step 2 is a step of performing a curing treatment on the coating film in which the polymerizable liquid crystal compound is aligned.

The method for the curing treatment to be performed on the coating film in which the polymerizable liquid crystal compound is aligned is not particularly limited, and examples thereof include a light irradiation treatment and a heat treatment. Among these, in view of manufacturing suitability, the light irradiation treatment is preferable, and an ultraviolet irradiation treatment is more preferable.

The irradiation condition of the light irradiation treatment is not particularly limited, but an irradiation amount of 50 to 1,000 mJ/cm$^2$ is preferable.

(Step 3)

The step 3 is a step of performing at least one of a stretching treatment or a shrinkage treatment on the cured film obtained in the step 2 so as to obtain a phase difference film. In this step, both of the stretching treatment and the shrinkage treatment may be performed, and for example, the kind of the process may be changed according to the direction such as the stretching treatment in one direction and the shrinkage treatment in the other direction.

Examples of the method of stretching treatment include well-known methods of the stretching treatment such as monoaxial stretching and biaxial stretching.

As a method of the shrinkage treatment (particularly, a heat shrinkage treatment), for example, methods disclosed in JP2006-215142A, JP2007-261189A, and JP4228703B can be referred to.

Examples of the support include a support (heat shrinkable support) or the like which shrinks in a specific direction in a case of the heat treatment in a case of stretching. For example, by using such a support, it is possible to shrink the cured film in the shrinkage direction of the support while stretching in a specific direction.

As the direction of performing a stretching treatment and/or a shrinkage treatment (hereinafter, collectively and simply referred to as a "specific treatment") on the cured film, appropriate and optimum direction is selected depending on the kind of the polymerizable liquid crystal compound used and the alignment direction thereof.

For example, in a case where a rod-like liquid crystal compound is used as the polymerizable liquid crystal compound and the polymerizable liquid crystal compound is aligned in the direction vertical to the coating film surface in the step 1, it is possible to obtain a phase difference film indicating a predetermined order parameter by stretching the cured film in one direction parallel to the surface (main surface) of the cured film and shrinking the cured film in a direction orthogonal to the one direction in the plane.

In a case where the change of the order parameter of the mesogen group before and after the specific treatment is described, in a case where the direction in which the cured film is stretched is set as the x axis, the cured film before the specific treatment satisfies the relationship of $Sz>Sx≈Sy$ in many cases. Since the stretching in the x axis direction and the shrinkage in the y axis direction are performed by the specific treatment, the cured film (corresponding to a phase difference film) on which the specific treatment was performed satisfies the relationship of $Sx>Sz>Sy$.

In a case where a rod-like liquid crystal compound is used as the polymerizable liquid crystal compound and the polymerizable liquid crystal compound is aligned in the horizontal direction with respect to the coating film surface in the step 1, it is possible to obtain a phase difference film indicating a predetermined order parameter by shrinking the cured film in the direction orthogonal to the in-plane slow axis direction of the cured film in the plane.

In a case where the change of the order parameter of the mesogen group before and after the specific treatment is described, in a case where the shrinkage direction is the y axis, the cured film before the specific treatment satisfies the relationship of $Sx>Sy≈Sz$ in many cases. Since the shrinkage in the y axis direction is performed by the specific treatment, the cured film (corresponding to a phase difference film) on which the specific treatment is performed satisfies the relationship of $Sx>Sz>Sy$.

In a case where a disc-like liquid crystal compound is used as the polymerizable liquid crystal compound and the polymerizable liquid crystal compound is aligned in the direction vertical to the coating film surface in the step 1, it is possible to obtain a phase difference film indicating a predetermined order parameter by stretching the cured film in the in-plane slow axis direction of the cured film and the direction orthogonal to the in-plane slow axis direction of the cured film in the plane.

In a case where the change of the order parameter of the mesogen group before and after the specific treatment is described, in the cured film before performing the specific treatment, the relationship of $Sy>Sx≈Sz$ is satisfied in many cases. Further, since stretching in the x axis direction and the y axis direction is performed by the specific treatment, the cured film (corresponding to a phase difference film) on which the specific treatment is performed satisfies the relationship of $Sy>Sz>Sx$.

In a case where a disc-like liquid crystal compound is used as the polymerizable liquid crystal compound and the polymerizable liquid crystal compound is aligned in the horizontal direction with respect to the coating film surface in the step 1, it is possible to obtain a phase difference film indicating a predetermined order parameter by stretching the cured film in the in-plane slow axis direction of the cured film and shrinking the cured film in a direction orthogonal to the in-plane slow axis direction of the cured film in the plane.

In a case where the change of the order parameter of the mesogen group before and after the specific treatment is described, in the cured film before performing the specific process, the relationship of $Sz>Sx≈Sy$ is satisfied in many cases. Since the stretching in the x axis direction and the shrinkage in the y axis direction are performed by the specific treatment, the cured film (corresponding to the phase difference film) on which the specific treatment is performed satisfies the relationship of $Sy>Sz>Sx$.

The method of the stretching treatment and the shrinkage treatment has been described above, but the present invention is not limited thereto, and the optimum treatment is appropriately performed depending on the kind of liquid crystal compound to be used.

The degree of stretching and shrinkage is appropriately adjusted so as to obtain Expressions (1) to (3) or (4) to (6).

The film thickness of the phase difference film is not particularly limited, but is preferably 20.0 µm or less and more preferably 10.0 µm or less, in view of thinning. The lower limit is not particularly limited, but is preferably 1.0 m or more in view of handleability.

The phase difference film preferably has a single layer structure in view of thinning.

(Applications)

The phase difference film described above can be applied to various applications, and for example, the phase difference film can be used as a so-called λ/4 plate or λ/2 plate by adjusting the in-plane retardation of the phase difference film.

The λ/4 plate is a plate having a function of converting linearly polarized light at a specific wavelength into circularly polarized light (or circularly polarized light into linearly polarized light). More specifically, the in-plane retardation Re at a predetermined wavelength λ nm is a plate exhibiting λ/4 (or an odd multiple thereof).

The in-plane retardation (Re (550)) at a wavelength of 550 nm of the λ/4 plate may have an error of about 25 nm about the ideal value (137.5 nm), for example, the in-plane retardation is preferably 110 to 160 nm and more preferably 120 to 150 nm.

The λ/2 plate refers to an optically anisotropic layer in which the in-plane retardation Re (λ) at a specific wavelength k nm satisfies Re (λ) λ/2. This expression may be achieved at any wavelength in the visible light range (for example, 550 nm). Among them, it is preferable that the in-plane retardation Re (550) at a wavelength of 550 nm satisfy the following relationship.

210 nm≤Re(550)≤300 nm

A phase difference film and an optical film including the phase difference film may be included in a display device. That is, more specific examples of the application of the phase difference film include a λ/2 optical compensation film for optically compensating liquid crystal cells and a λ/4 anti-reflective film used for display devices such as an organic electro-luminescence (EL) display devices.

Particularly, the phase difference film according to the embodiment of the present invention is suitably used for an optical compensation film of an in plane switching (IPS) type liquid crystal display device, and can improve tint change in a case of being viewed from an oblique direction and light leakage in a case of black display.

<Optical Film>

Examples of the optical film including the phase difference film include an optical film including a polarizer and a phase difference film.

The polarizer may be a member (linear polarizer) having a function of converting light into specific linearly polarized light and mainly an absorptive polarizer.

As the absorption polarizer, an iodine-based polarizer, a dye-based polarizer using a dichroic dye, a polyene-based polarizer, and the like are used. Examples of the iodine-based polarizer and the dye-based polarizer include a coating type polarizer and a stretching type polarizer, and both can be applied, but a polarizer manufactured by adsorbing iodine or a dichroic dye to polyvinyl alcohol and stretching the resultant is preferable.

The relationship between the absorption axis of the polarizer and the in-plane slow axis of the phase difference film is not particularly limited, but in the case where the phase difference film is a λ/4 plate and the optical film is used as a circularly polarizing film, an angle formed by the absorption axis of the polarizer and the in-plane slow axis of the phase difference film is preferably 45°+10°.

EXAMPLES

Hereinafter, the present invention is specifically described with reference to the examples. A material, an amount used, a treatment detail, a treatment order, and the like provided in the following examples can be suitably changed without departing from the gist of the present invention. The scope of the present invention should not be limited by the following specific examples.

Example 1

<Manufacturing of Temporary Support>

Pellets of a mixture (Tg 127° C.) of 90 parts by mass of an acrylic resin having a lactone ring structure represented by Formula (II) {Copolymerization monomer mass ratio=methyl methacrylate/methyl 2-(hydroxymethyl) acrylate=8/2, a lactone cyclization ratio: about 100%, a content proportion of a lactone ring structure: 19.4%, a weight-average molecular weight: 133,000, a melt flow rate: 6.5 g/10 min (240° C., 10 kgf), Tg 131° C.} and 10 parts by mass of an acrylonitrile-styrene (AS) resin {TOYO AS AS20, manufactured by Toyo-Styrene Co., Ltd.}; were supplied to a biaxial extruder and were melted and extruded in a sheet form at about 280° C. Thereafter, the melt-extruded sheet was longitudinally stretched at an air supply temperature of 130° C., a sheet surface temperature of 120° C., a stretching speed of 30%/min, and a stretching ratio of 35% in a longitudinal monoaxial stretching machine. Thereafter, the longitudinally stretched sheet was stretched in a cross direction in a tenter type stretching machine at an air supply temperature of 130° C., a sheet surface temperature of 120° C., a stretching speed of 30%/min, and a stretching ratio of 35%. Thereafter, the sheet stretched in the cross direction was cut off at both ends in front of the winding portion and was wound up as a roll film having a length of 4,000 m so as to obtain a long temporary support having a thickness of 40 μm.

(II)

In Formula (II), $R^1$ is a hydrogen atom, and $R^2$ and $R^3$ are methyl groups.

<Forming of Alignment Layer>

The temporary support was continuously coated with an alignment layer coating liquid (λ) in the following composition with a #14 wire bar. The temporary support coated with the alignment layer coating liquid was dried with warm air at 60° C. for 60 seconds and further with warm air at 100° C. for 120 seconds to form an alignment layer on the temporary support.

The saponification degree of the modified polyvinyl alcohol used was 96.8%.

| -Composition of alignment layer coating liquid (A)- | |
| --- | --- |
| Modified polyvinyl alcohol | 10 parts by mass |
| Water | 308 parts by mass |
| Methanol | 70 parts by mass |
| Isopropanol | 29 parts by mass |
| Photopolymerization initiator (IRGACURE (trade name) 2959 manufactured by BASF SE) | 0.8 parts by mass |

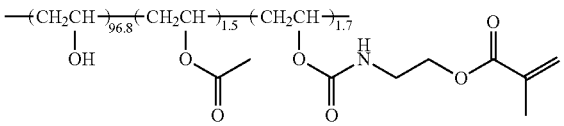

Modified Polyvinyl Alcohol

The compositional ratio of the modified polyvinyl alcohol is a molar fraction.

<Forming of Liquid Crystal Layer>

Subsequently, the formation of a liquid crystal layer in which the rod-like liquid crystal compounds are vertically aligned and fixed in a nematic phase is described.

The composition 1 was dissolved in methyl ethyl ketone (MEK) and was prepared such that a concentration of solid content was 10 mass % so as to obtain a coating liquid. The alignment layer was bar-coated with the obtained coating liquid, and heat aging was performed at 120° C. for two minutes, so as to obtain a uniform alignment state of the rod-like liquid crystal compound in the coating film. Thereafter, the coating film is maintained at 120° C., and irradiated with ultraviolet light at 120° C. and 100 mJ/cm² using a metal halide lamp so as to form a liquid crystal layer (film thickness: 8 m).

| -Composition 1- | |
|---|---|
| Rod-like liquid crystal compound (1) | 70 parts by mass |
| Rod-like liquid crystal compound (2) | 30 parts by mass |
| Polymerization initiator 1 | 1.5 parts by mass |
| Polymerization initiator 2 (Irgacure 184 manufactured by BASF SE) | 1.5 parts by mass |
| Vertical alignment agent 1 | 0.5 parts by mass |
| Polymerizable compound | 0.5 parts by mass |
| Surfactant 1 | 0.2 parts by mass |
| Surfactant 2 | 0.4 parts by mass |

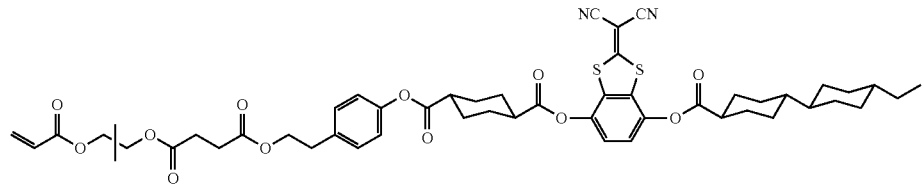

Rod-like liquid crystal compound (1)

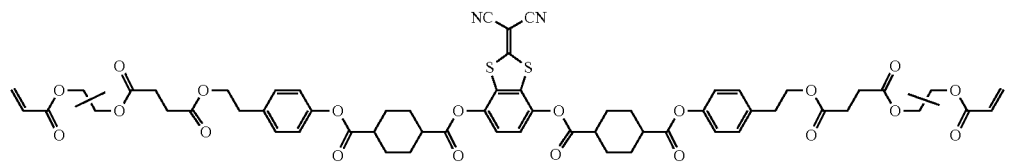

Rod-like liquid crystal compound (2)

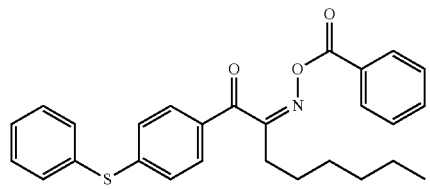

Polymerization initiator 1

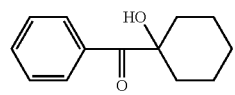

Polymerization initiator 2

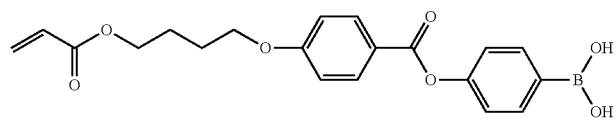

Vertical alignment agent 1

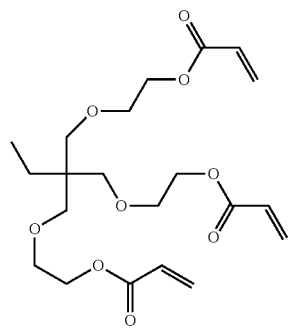

Polymerizable compound

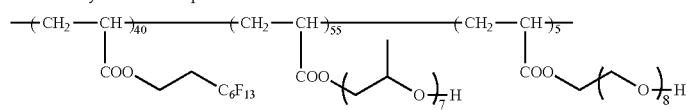

Surfactant 1

-continued

-Composition 1-

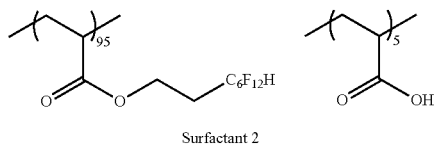

Surfactant 2

<Deformation>

The film including the temporary support and the liquid crystal layer manufactured as described above was deformed in a batch stretching machine with four sides fixed by tenter at an air supply temperature of 140° C., a film surface temperature of 130° C., and a deformation speed of 30%/min, so as to obtain the deformation ratio as presented in Table 1 (X direction 80% stretch, and Y direction 10% shrinkage). Then, the edge portions of four sides of the obtained film were cut off, so as to obtain a stretched film 1 including the temporary support and the phase difference film.

The X direction is intended to be the in-plane slow axis direction, and the Y direction is a direction orthogonal to the X direction in the plane. The same is applied to Examples 2 to 4 described below.

Example 2

A film including a temporary support and a liquid crystal layer was obtained in the same order of Example 1, except that the rubbing treatment is performed in the X direction on the alignment layer by using the composition 2 instead of the composition 1.

The obtained film was deformed in a batch stretching machine with four sides fixed by tenter at an air supply temperature of 140° C., a film surface temperature of 130° C., and a deformation speed of 30%/min, so as to obtain the deformation ratio as presented in Table 1 (X direction 0% stretch, and Y direction 40% shrinkage). Then, the end portions of the obtained film on four sides were cut off, so as to obtain a stretched film 2 including the temporary support and the phase difference film.

| -Composition 2- | |
|---|---|
| Rod-like liquid crystal compound (1) | 70 parts by mass |
| Rod-like liquid crystal compound (2) | 30 parts by mass |
| Polymerization initiator 1 | 1.5 parts by mass |
| Polymerization initiator 2 (Irgacure 184 manufactured by BASF SE) | 1.5 parts by mass |

-continued

| -Composition 2- | |
|---|---|
| HISORB MTEM | 2.0 parts by mass |
| NK ESTER A-200 | 1.0 part by weight |
| Surfactant 3 (the following structural formula) | 0.2 parts by mass |

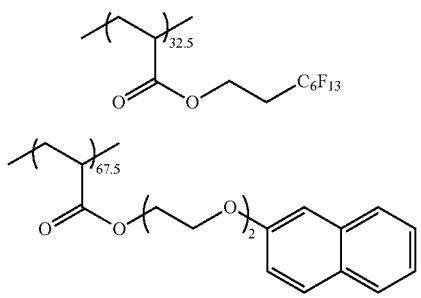

Example 3

A film including a temporary support and a liquid crystal layer was obtained in the same order of Example 1, except that the rubbing treatment was performed in the Y direction by using the composition 3 instead of the composition 1.

The obtained film was deformed in a batch stretching machine with four sides fixed by tenter at an air supply temperature of 140° C., a film surface temperature of 130° C., and a deformation speed of 30%/min, so as to obtain the deformation ratio as presented in Table 1 (X direction 50% stretch, and Y direction 10% shrinkage). Then, the end portions of the obtained film on four sides were cut off, so as to obtain a stretched film 3 including the temporary support and the phase difference film.

—Composition 3—

The composition 3 corresponds to a composition using a compound 101 instead of the rod-like liquid crystal compound (1) in the composition 1, a compound 102 instead of the rod-like liquid crystal compound (2), and a vertical alignment agent 2 (2.0 parts by mass) instead of the vertical alignment agent 1 (0.5 parts by mass).

| Disc-like liquid crystal compound |
|---|
| Compound 101 |

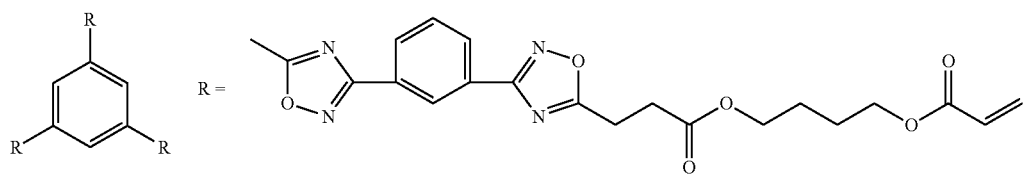

| Disc-like liquid crystal compound | |
|---|---|
| 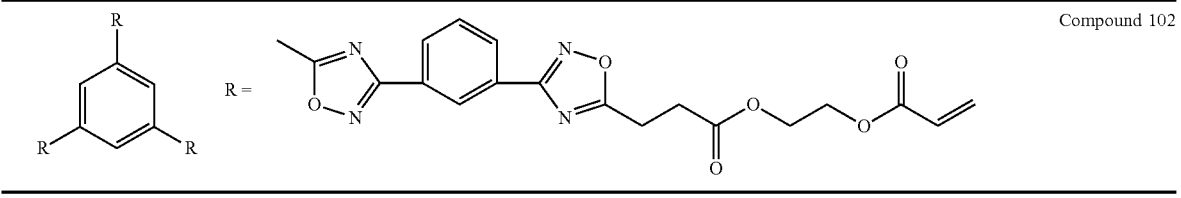 | Compound 102 |

Vertical Alignment Agent 2

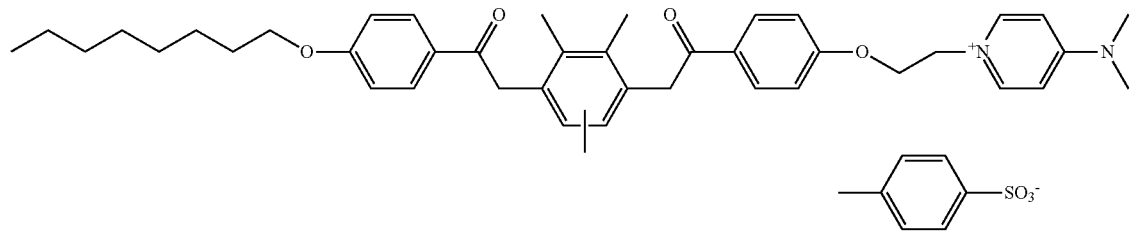

Example 4

A film including a temporary support and a liquid crystal layer was obtained in the same order of Example 1, except the composition 4 was used instead of the composition 1.

The obtained film was deformed in a batch stretching machine with four sides fixed by tenter at an air supply temperature of 140° C., a film surface temperature of 130° C., and a deformation speed of 30%/min, so as to obtain the deformation ratio as presented in Table 1 (X direction 20% stretch, and Y direction 50% shrinkage). Then, the end portions of the obtained film on four sides were cut off, so as to obtain a stretched film 4 including the temporary support and the phase difference film.

—Composition 4—

The composition 4 corresponds to a composition using the compound 101 instead of the rod-like liquid crystal compound (1) in the composition 2, the compound 102 instead of the rod-like liquid crystal compound (2), and a surfactant 4 (0.8 parts by mass) instead of the surfactant 3 (0.2 parts by mass).

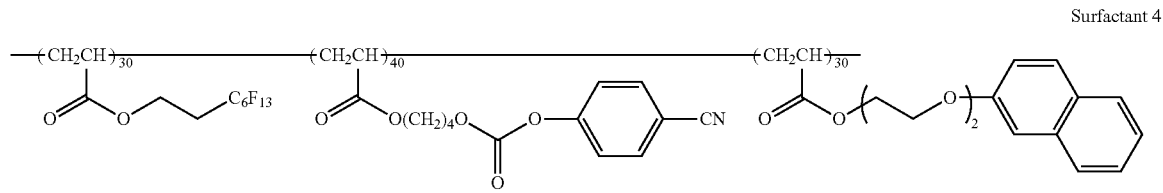

Surfactant 4

Comparative Examples 1 to 4

Films including a temporary support and a liquid crystal layer before the stretching treatment is performed which were manufactured in Examples 1 to 4 were used as films of Comparative Examples 1 to 4.

The temporary supports stretched from the films manufactured in the examples and the comparative examples by the method described above were peeled off, and the order parameters and Nz factors of the mesogen groups in the obtained phase difference film were calculated. The results are summarized in Table 1.

In Table 1, the "initial alignment" indicates the alignment direction of the mesogen group with respect to the film surface in the cured film (liquid crystal layer) before the stretching treatment is performed.

In Table 1, the "film thickness" represents the film thicknesses of the phase difference films obtained in Examples 1 to 4, and the film thicknesses of the liquid crystal layers in Comparative Examples 1 to 4.

TABLE 1

|  |  | Example 1 | Example 2 | Example 3 | Example 4 | Comparative Example 1 | Comparative Example 2 | Comparative Example 3 | Comparative Example 4 |
| --- | --- | --- | --- | --- | --- | --- | --- | --- | --- |
| Structure of mesogen group | | Rod shape | Rod shape | Disc shape | Disc shape | Rod shape | Rod shape | Disc shape | Disc shape |
| Initial alignment | | Vertical | Horizontal | Vertical | Horizontal | Vertical | Horizontal | Vertical | Horizontal |
| Deformation ratio | X direction [%] | 80 | 0 | 50 | 20 | — | — | — | — |
|  | Y direction [%] | −10 | −40 | 10 | −50 | — | — | — | — |
| Order parameter | Sx | 0.298 | 0.302 | −0.253 | −0.286 | −0.352 | 0.670 | −0.320 | −0.333 |
|  | Sy | −0.301 | −0.256 | 0.267 | 0.194 | −0.352 | −0.334 | 0.642 | −0.332 |
|  | Sz | 0.003 | −0.046 | −0.014 | 0.092 | 0.704 | −0.336 | −0.322 | 0.665 |
| Film thickness [μm] | | 4.7 | 13.3 | 5.0 | 11.4 | 8.0 | 8.0 | 8.0 | 8.0 |
| Nz factor | | 0.49 | 0.67 | 0.44 | 0.79 | −403 | 1.00 | −0.01 | 352 |

As presented in Table 1, it was confirmed that a phase difference film satisfying a predetermined order parameter indicates a desired Nz factor.

What is claimed is:

1. A phase difference film formed by using a composition including a polymerizable liquid crystal compound having a mesogen group,
wherein, in the phase difference film, in a case where an order parameter of the mesogen group in an in-plane slow axis direction of the phase difference film is set as Sx, an order parameter of the mesogen group in a direction orthogonal to the in-plane slow axis direction in a plane is set as Sy, and an order parameter of the mesogen group in a thickness direction of the phase difference film is set as Sz,
in a case where the mesogen group has a rod shape, requirements of Expressions (1) to (3) are satisfied, and
in a case where the mesogen group has a disc shape, requirements of Expressions (4) to (6) are satisfied, $$Sx > Sz > Sy \quad \text{Expression (1)}$$

$$-0.300 < Sz < 0.200 \quad \text{Expression (2)}$$

$$Sx > 0.050 \quad \text{Expression (3)}$$

$$Sy > Sz > Sx \quad \text{Expression (4)}$$

$$-0.200 < Sz < 0.300 \quad \text{Expression (5)}$$

$$Sy > 0.050 \quad \text{Expression (6)}$$

here, in a case where the mesogen group has a rod shape, the order parameter is calculated by using a long axis of the mesogen group as a reference, and in a case where the mesogen group has a disc shape, the order parameter is calculated by using an axis orthogonal to a disc surface of the mesogen group, as a reference, and
in a case where the in-plane slow axis direction of the phase difference film is set as an x axis, a direction orthogonal to the in-plane slow axis direction is set as a y axis, and the thickness direction of the phase difference film is set as a z axis, and angles between an average alignment direction M of the mesogen groups, and the x axis, the y axis, and the z axis are $\theta_X$, $\theta_Y$, and $\theta_Z$, the order parameter Sx, the order parameter Sy, and the order parameter Sz are respectively represented by the following expressions:

$$Sx = \frac{3\langle \cos^2 \theta x \rangle - 1}{2}$$

$$Sy = \frac{3\langle \cos^2 \theta y \rangle - 1}{2}$$

$$Sz = \frac{3\langle \cos^2 \theta z \rangle - 1}{2}.$$

2. The phase difference film according to claim 1,
wherein, in a case where the mesogen group has a rod shape, requirements of Expressions (1), (3), and (7) are satisfied, and
in a case where the mesogen group has a disc shape, requirements of Expressions (4), (6), and (8) are satisfied.

$$Sx > Sz > Sy \quad \text{Expression (1)}$$

$$-0.040 < Sz < 0.040 \quad \text{Expression (7)}$$

$$Sx > 0.050 \quad \text{Expression (3)}$$

$$Sy > Sz > Sx \quad \text{Expression (4)}$$

$$-0.040 < Sz < 0.040 \quad \text{Expression (8)}$$

$$Sy > 0.050 \quad \text{Expression (6).}$$

3. The phase difference film according to claim 1, wherein a film thickness is 20.0 μm or less.

4. The phase difference film according to claim 1, which has a single layer structure.

5. The phase difference film according to claim 1, wherein an in-plane retardation Re (550) at a wavelength of 550 nm is 110 to 160 nm.

6. An optical film comprising:
the phase difference film according to claim 1.

7. The optical film according to claim 6, further comprising:
a polarizer.

8. A display device comprising:
the phase difference film according to claim 1.

9. A display device comprising:
the optical film according to claim 6.

10. The phase difference film according to claim 2, wherein a film thickness is 20.0 μm or less.

11. The phase difference film according to claim 2, which has a single layer structure.

12. The phase difference film according to claim 3, which has a single layer structure.

13. The phase difference film according to claim 2, wherein an in-plane retardation Re (550) at a wavelength of 550 nm is 110 to 160 nm.

14. The phase difference film according to claim 3, wherein an in-plane retardation Re (550) at a wavelength of 550 nm is 110 to 160 nm.
15. The phase difference film according to claim 4, wherein an in-plane retardation Re (550) at a wavelength of 550 nm is 110 to 160 nm.
16. An optical film comprising:
the phase difference film according to claim 2.
17. An optical film comprising:
the phase difference film according to claim 3.
18. An optical film comprising:
the phase difference film according to claim 4.
19. An optical film comprising:
the phase difference film according to claim 5.
20. A display device comprising:
the phase difference film according to claim 2.

* * * * *